United States Patent [19]

McDavid

[11] Patent Number: 4,672,419
[45] Date of Patent: Jun. 9, 1987

[54] METAL GATE, INTERCONNECT AND CONTACT SYSTEM FOR VLSI DEVICES

[75] Inventor: James M. McDavid, Dallas, Tex.

[73] Assignee: Texas Instruments Incorporated, Dallas, Tex.

[21] Appl. No.: 624,165

[22] Filed: Jun. 25, 1984

[51] Int. Cl.⁴ ............................................. H01L 23/48
[52] U.S. Cl. ...................................... 357/71; 357/67; 357/23.9; 357/41; 357/65
[58] Field of Search .................. 357/67 S, 71 S, 23.1, 357/23.2, 23.5, 23.6, 23.9, 41, 65

[56] References Cited

U.S. PATENT DOCUMENTS

| | | | |
|---|---|---|---|
| 3,657,029 | 4/1972 | Fuller | 357/71 S X |
| 3,724,065 | 4/1973 | Carbajal, III et al. | 357/23.9 X |
| 4,141,022 | 2/1979 | Sigg et al. | 357/71 S X |
| 4,445,134 | 4/1984 | Miller | 357/67 S X |
| 4,478,679 | 10/1984 | Chang et al. | 357/23.9 X |
| 4,506,279 | 3/1985 | Mizutani | 357/23.1 X |

FOREIGN PATENT DOCUMENTS 0008310  4/1975  Japan ................................ 357/71 S Primary Examiner—J. Carroll
Assistant Examiner—William A. Mintel
Attorney, Agent, or Firm—John G. Graham

[57] ABSTRACT

A metal gate and contact/interconnect system for MOS VLSI devices employs a multiple-level refractory metal structure including a thin layer of molybdenum for adhesion to oxide and a thicker layer of tungsten over the molybdenum. The metal gate is encapsulated in oxide during a self-aligned siliciding operation. A contact to the silicide-clad source/drain region includes a thin tungsten layer, then the molybdenum/tungsten stack, and a top layer of gold.

6 Claims, 4 Drawing Figures

METAL GATE, INTERCONNECT AND CONTACT SYSTEM FOR VLSI DEVICES

BACKGROUND OF THE INVENTION

This invention relates to the manufacture of semiconductor devices, and more particularly to a metallization system for gates, contacts and interconnects in MOS VLSI devices.

In the manufacture of MOS VLSI devices such as high density dynamic RAMs or the like, the use of metal gates and interconnects has become necessary inasmuch as the resistance of the commonly used gate material polycrystalline silicon makes it unsuitable for such high density applications. When the width of the gate, conductors, etc., is reduced to the one micron range, and the thickness also reduced to avoid step coverage problems, then the use of metal instead of polysilicon becomes mandatory. The selection of a single metal to perform the gate, contact and interconnect functions results in a number of compromises. Thus, multiple metal systems have evolved. Yet, the problems of contact resistance, adherance to oxide, process incompatability, electromigration, and other factors have limited the utility of the prior systems due to one or more shortcomings.

It is the principal object of the invention to provide an improved method of making metal-gate MOS VLSI devices, particularly high density memory cell arrays or the like. Another object is to provide an improved contact and interconnect system and metal-gate transistor structure as may be used in very high density memory arrays. A further object is to provide an improved metallization system with low contact and sheet resistance, good adhesion, good electromigration resistance, and minimal process and materials complexity.

SUMMARY OF THE INVENTION

In accordance with the embodiment of the invention, a metal gate and contact/interconnect system for MOS VLSI devices employs a multiple-level refractory metal structure including a thin layer of molybdenum for adhesion to oxide and a thicker layer of tungsten over the molydbenum. The metal gate is encapsulated in oxide during a self-aligned siliciding operation. A contact to the silicide-clad source/drain region includes a thin tungsten layer, then the molybdenum/tungsten stack, and a top layer of gold.

BRIEF DESCRIPTION OF THE DRAWINGS

The novel feature believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENT

Figure 1:
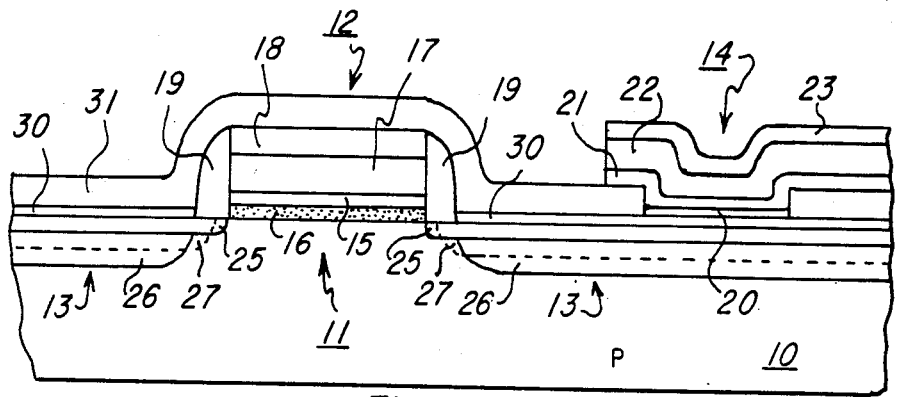
FIG. 1 is an elevation view in section, greatly enlarged, of a very small part of a semiconductor integrated circuit chip, showing the contact and interconnect structure of the invention.

Referring to FIG. 1, a semiconductor device is illustrated using the contact system of the invention. A silicon substrate 10 has a metal-gate MOS transistor 11 formed thereon, with the transistor having a stacked gate 12, multiple implanted source/drain regions 13, and a metal-to-silicon contact 14 to one of the source/drain regions. It is understood, of course, that there would be hundreds of thousands of such transistors and like structures in a single chip. This metallization structure is particularly useful for high density dynamic RAMs, such as the 1-Megabit DRAM, where the minimum dimensions are about one or two microns.

According to the invention, the gate 12 and the contact 14 are composed of multiple layers of metals. The gate has a thin layer of molybdenum 15 over a thin gate oxide 16, and a thicker layer of tungsten 17 over the moly 15. A layer of cap oxide 18 covers the tungsten and moly to protect it during the siliciding and implant operations, as will be described, and likewise sidewall oxide elements 19 complete the encapsulation of the metal layers 15 and 17.

The metal-to-silicon contact 14 of course must be formed after the gate stack has been completed. The contact 14 consists of, first, a thin tungsten layer 20, then a molybdenum layer 21 (corresponding to the moly layer 15), followed by a tungsten layer 22 (like the tungsten layer 17) and a gold layer 23 on top.

The source/drain implant arrangement for creating the regions 13 include first a shallow, low-concentration N implant 25 self-aligned with the edges of the gate stack 12 before the sidewall oxide 19 is in place. Then, after the sidewall oxide has been formed, a deep, high concentration N+ arsenic implant produces a deep region 26, and a lower-concentration phosphorus implant diffuses faster and creates a reach-through N region 27. This implant sequence provides a lightly doped drain structure to minimize the effects of impact ionization, but yet provides a relatively low series resistance to the edge of the channel (due to implant 25), and a heavily doped, low resistance area away from the transistor where the contact 14 is to be made.

A layer 30 of tungsten silicide is created by depositing elemental tungsten on the entire face of the slice after the sidewall oxide 19 is in place and the implants have been completed, and reacting the tungsten with the exposed silicon, then removing the unreacted tungsten.

A silicon oxide layer 31 is deposited over the gate and silicided source/drain areas, and an opening defined in this oxide for the contact 14.

The various materials and structures in this metallization and contact system are selected for the objectives of low contact and line resistance, good adhesion, good electromigration resistance, and minimal process and material complexity. Deposition methods are low damage and high purity, as required. Encapsulation is employed when needed for protection of the metal layers during high temperature processing and protection from contamination.

The tungsten silicide 30 on the exposed silicon source/drain or "moat" areas is needed to lower the sheet resistance of these areas while allowing the source/drain regions 13 to be quite shallow, necessary for scaled devices, i.e., of small dimensions. The gate 12 is mostly composed of the tungsten layer 17 of which is 3000 Å thick compared to 500 Å thickness of the molybdenum 15, but the molybdenum 15 is needed for its adhesion to the silicon oxide coating 16. The contact 14 employs the thin tungsten layer 20 for enhancing the electrical and mechanical contact to the tungsten silicide 30, since tungsten adheres better and makes lower resistance contact to this material, compared to molybdenum; however, the thin molybdenum layer 21 is needed over the oxide 31 to promote adhesion, so the layer 20 must be limited to only the contact hole. The bulk of the contact and interconnect is the tungsten layer 22 which is 7000 Å in thickness. The gold layer 23 is added for its very high conductivity, its malleability in bonding wires to it at bonding pads, and its non-reactive and electromigration properties. For less demanding applications the gold may be omitted. The thickness of this gold cladding is about 4000 Å.

Figure 2:
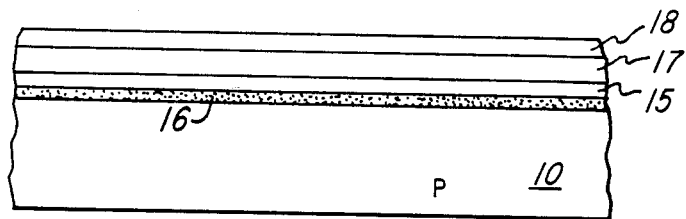
FIGS. 2-4 are elevation views in section of the device of FIG. 1, at successive stages in the manufacture thereof.
Figure 3:
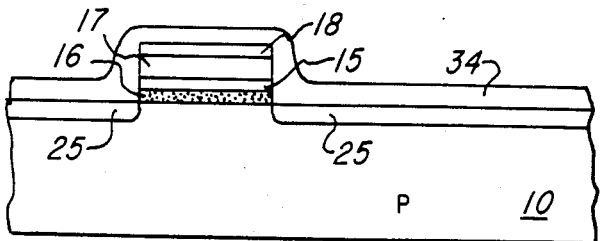
Figure 4:
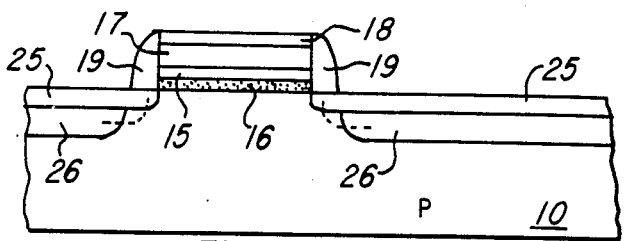

A method of constructing the device of FIG. 1 according to the invention will be described with reference to FIGS. 2-4. First the gate oxide 16 is thermally grown to a thickness of perhaps 200 to 300 Å on a suitably prepared surface of a silicon slice. It is understood that this contact and interconnect arrangement may be part of a CMOS process, using N wells and field oxide and/or field plate isolation between elements on the face, so there are many process steps unrelated to the structure of FIG. 1 that would be previously implemented. The moly layer 15 is deposited over the gate oxide 16 to a thickness of about 500 Å, then the tungsten layer 17 is applied, and the cap oxide 18 is deposited by plasma and/or CVD as seen in FIG. 2. This multilayer structure is patterned by a photolithographic process to leave the gate stack of FIG. 3. The shallow arsenic implant 25 is now peformed at low dosage. Thereafter a layer 34 of oxide is applied over the entire face by deposition, then this layer is anistropically etched to leave only the sidewall segments 19 (seen in FIG. 1). At this point the gate metal is totally encapsulated in the oxide 18 and 19 so that it will not be degraded by the subsequent siliciding and etch. The deep arsenic implant 26 is now performed, along with the phosphorus implant 27 and annealed for drive in, as seen in FIG. 4. The deep, high concentration arsenic implant is self-aligned with the sidewalls 19, whereas the phosphorus is diffused laterally beneath the sidewalls. Analogous processing steps apply for P-channel devices in a CMOS circuit.

The next step in the process is applying a thin coating of tungsten to the entire face of the slice, both on the bare silicon source/drain regions and over the gate stack, and then heating to react the tungsten with the exposed silicon to create the tungsten silicide regions 30, consuming part of the exposed silicon. These silicide regions 30 are self-aligned with the sidewall oxide spacers 19. The metal in the gate stack is protected by the oxide. The unreacted tungsten is then removed by an etchant, leaving tungsten silicide of a thickness of about 1500 Å.

The oxide 31 is next deposited to a thickness of about 8000 Å, and photo resist is applied and exposed for the purpose of etching the hole for the contact 14. After the oxide 31 is etched here, a thin coating of tungsten 20 is applied to the entire top face, over the photoresist, so when the photoresist is stripped the excess tungsten will also be lifted off, leaving only the coating 20 in the contact hole. The layers of molybdenum 21, tungsten 22 and gold 23 and then deposited and the stack is patterned, leaving the structure of FIG. 1.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A gate, contact and interconnect structure for a MOS integrated circuit formed on a substrate of a first conductivity type, comprising:
a metal gate on a face of a silicon body comprising a layer of molybdenum overlying and adhered to a layer of silicon dioxide, a thicker layer of tungsten over said gate and a coating of oxide on the top of said gate and on the sidewalls of said gate totally encapsulating said gate;
heavily-doped source/drain regions of a second conductivity type opposite to said first conductivity type in said face self-aligned with said oxide on the sidewalls of the metal;
an insulator coating on said face over said metal gate and said source/drain regions;
a metal contact and interconnect strip extending along a portion of said face overlying said insulator coating and extending into a contact hole in said insulator coating to make electrical connection to one of said source/drain regions, and comprising:
a layer of silicide over said contact hole, a layer of tungsten over said silicide layer only in said contact hole but not over said insulator coating, a layer of molybdenum over said layer of tungsten and partially over said insulator coating, a thicker layer of tungsten over said molybdenum, and a layer of gold over said thicker layer of tungsten.

2. A device according to claim 1, wherein said source/drain regions include regions of said second conductivity type of lesser depth than said heavily doped source/drain regions self-aligned with said metal gate before said sidewall oxide is applied.

3. A device according to claim 1, wherein said substrate is P-type, and said source/drain regions are N+ type.

4. A device according to claim 1, wherein said layer of tungsten of the metal gate is much thicker than said layer of molybdenum such that the electrical body resistance of the gate is substantially that of the tungsten.

5. A structure according to claim 1, wherein said silicide extends over the surface of substantially the whole of said source/drain regions below said insulator coating self-aligned with said oxide on the sidewalls of the metal gate.

6. A structure according to claim 2, wherein said source/drain regions include a reach through region of said second conductivity type self aligned with said sidewall oxides of said gate.

* * * * *